United States Patent
Liu et al.

(10) Patent No.: US 6,278,182 B1
(45) Date of Patent: Aug. 21, 2001

(54) LEAD FRAME TYPE SEMICONDUCTOR PACKAGE

(75) Inventors: Wen-Chun Liu; Chien-Hung Lai, both of Kaohsiung (TW)

(73) Assignee: Walsin Advanced Electronics Ltd., Kaohsiung (TW)

( * ) Notice: Subject to any disclaimer, the term of this patent is extended or adjusted under 35 U.S.C. 154(b) by 0 days.

(21) Appl. No.: 09/372,923

(22) Filed: Aug. 12, 1999

(30) Foreign Application Priority Data

Jan. 6, 1999 (TW) ................................................ 88100105

(51) Int. Cl.[7] ........................ H01L 23/34; H01L 23/495; H01L 23/48; H01L 23/52; H01L 29/40
(52) U.S. Cl. ........................ 257/712; 257/713; 257/717; 257/667; 257/774; 257/780
(58) Field of Search ................................ 257/712, 713, 257/717, 667, 675, 676, 774, 780, 787

(56) References Cited

U.S. PATENT DOCUMENTS

| | | | |
|---|---|---|---|
| 5,105,259 | * 4/1992 | McShane et al. | 357/72 |
| 5,835,355 | * 11/1998 | Dordi | 361/760 |
| 5,977,633 | * 11/1999 | Suzuki et al. | 257/738 |
| 6,046,499 | * 4/2000 | Yano et al. | 257/712 |

* cited by examiner

Primary Examiner—Eddie Lee
Assistant Examiner—Jesse A. Fenty
(74) Attorney, Agent, or Firm—Jiawei Huang; J.C. Patents

(57) ABSTRACT

A semiconductor package containing a silicon chip, a lead frame, a plurality of conductive wires, a heat sink and some packaging material. Both the silicon chip and the heat sink are mounted on the lead frame, and the silicon chip is located between the heat sink and the lead frame. The silicon chip is electrically connected to some contact points on the lead frame by a plurality of conductive wires, and the space between the heat sink and the lead frame is filled with packaging material. The heat sink has a narrow pinhole gate and a plurality of conical positioning holes. The pinhole gate is formed in the middle of the heat sink so that packaging material can enter the mold cavity in the middle through the roof of the package. Both the pinhole gate and the positioning holes are filled with packaging material.

15 Claims, 2 Drawing Sheets

LEAD FRAME TYPE SEMICONDUCTOR PACKAGE

CROSS-REFERENCE TO RELATED APPLICATION

This application claims the priority benefit of Taiwan application serial no. 88100105, filed Jan. 6, 1999, the full disclosure of which is incorporated herein by reference.

BACKGROUND OF THE INVENTION

1. Field of Invention

The present invention relates to a semiconductor package structure. More particularly, the present invention relates to a semiconductor package with a higher cooling capability.

2. Description of Related Art

As the integration of an integrated circuit (IC) chip increases, capability and pin count of the IC package also increase correspondingly. In the meantime, the package is more vulnerable to interference by external electromagnetic fields and damages caused by high temperature. Due to an increase in the level of integration, overall volume of an IC package decreases or remains the same despite an increase in pin count. However, a larger pin count for the same package volume means that the pin-to-pin separation has to decrease, and a decrease in pin-to-pin separation renders IC chip packaging more difficult. To resolve the issue, a ball grid array (BGA) type of package structure has been developed. Furthermore, heat generated by the IC chip can be dissipated and unwanted electromagnetic fields can be shielded by including a heat sink in the package.

FIG. 1 is a schematic, cross-sectional view of a conventional BGA package. As shown in FIG. 1, a silicon chip 12 is mounted on a lead frame 10 and is electrically connected to the leads of the lead frame by conductive wires 14. There is a heat sink 16 arching over the lead frame 10, as well. Besides increasing the cooling of the silicon chip 12, the heat sink 16 is also capable of shielding the chip 12 against interference from external electromagnetic fields. The lead frame 10, the silicon chip 12, the conductive wires 14 and a portion of the heat sink 16 are enclosed by placing the lead frame 10 into a mold (not shown) after which a packaging material 20 is injected into the mold. On solidification, the packaging material 20 not only fixes the positions various internal elements, but also provides additional protection against vibration or impact. There is a metallic plate 13 at one corner of the lead frame 10. The metallic plate 13 is located under a gate (not shown), which is an opening through which the packaging material enters the mold. By introducing a smooth metallic plate 13 under the gate, packaging material 20 is able to flow rapidly into the mold cavity. After molding, the mold is dissembled and the package is taken out. Any residual material remaining above the gate can be easily scratched away due to the presence of a smooth metallic surface under the gate.

However, the gate is located at one corner of the packaging cavity inside a mold. Because packaging material 20 has to traverse the cavity from the gate at one corner to the opposite corner, a longer period is needed to fill the entire packaging cavity. Besides slowing the molding process, the longer flow path through this gate arrangement may introduce additional pressure that can result in residual stress inside the package after setting. Furthermore, to secure the heat sink 16, a large section of the heat sink 16 has to be enclosed by the packaging material 20. Since only a portion of the heat sink 16 is exposed, capacity for cooling a silicon chip is greatly reduced.

In brief, the disadvantages of a conventional BGA package include:
1. Since packaging material is injected through a gate at one corner of the packaging cavity, a high amount of residual stress is likely to remain inside the package on solidification. In addition, a longer period is needed to fill the entire packaging cavity.
2. After molding, residual material on the gate has to be removed from the package, thereby incurring addition cost.

SUMMARY OF THE INVENTION

Accordingly, one object of the present invention is to provide a semiconductor package structure that can be formed in fewer steps and has a higher quality.

A second object of the invention is to provide a semiconductor package having a higher cooling capacity and a more effective electromagnetic shield.

To achieve these and other advantages and in accordance with the purpose of the invention, as embodied and broadly described herein, the invention provides a semiconductor package. The package includes a silicon chip, a lead frame for supporting the silicon chip and a plurality of conductive wires that connects the silicon chip with leads on the lead frame. There is a heat sink above the silicon chip. The heat sink has a pinhole gate and a plurality of positioning holes. The pinhole gate is a narrow tubular pipeline. The positioning holes are conical cavities whose bigger diameter is away from the chip. In addition, the pinhole gate and the positioning holes on the heat sink are filled by packaging material during the process. The packaging material also encloses the silicon chip, the conductive wires and a portion of the heat sink. The packaging material is able to fix the positions of the silicon chip, the conductive wires and the heat sink relative to each other.

Furthermore, the pinhole gate is located in the middle of the roof of the packaging cavity. Hence, when packaging material is injected into the packaging cavity, a uniform pressure is created inside the cavity. Moreover, a three-piece mold is used. Therefore, when the mold is dissembled, residual packaging material breaks at the junction between the pinhole gate and the mold gate. Hence, there is no need to remove residual material in a separate step. Moreover, the conical holes on the heat sink are able to position the heat sink when packaging material inside the holes solidifies.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
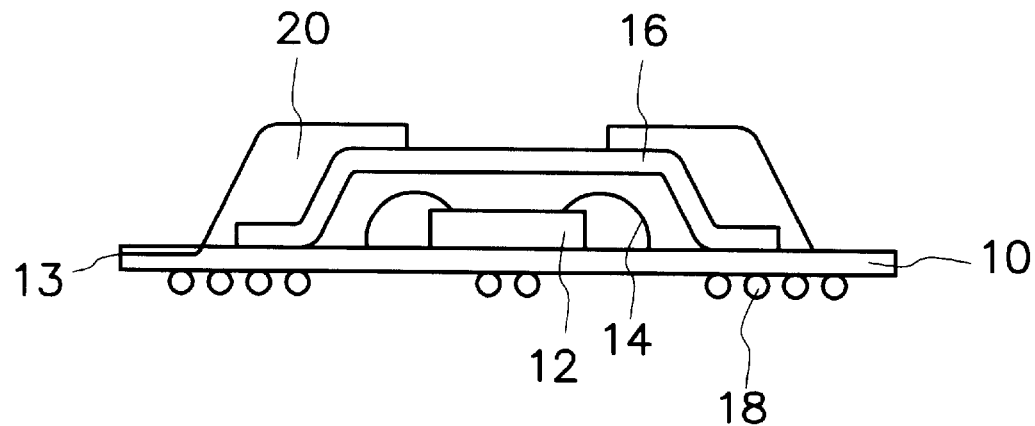
FIG. 1 is a schematic cross-sectional view of a conventional BGA package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
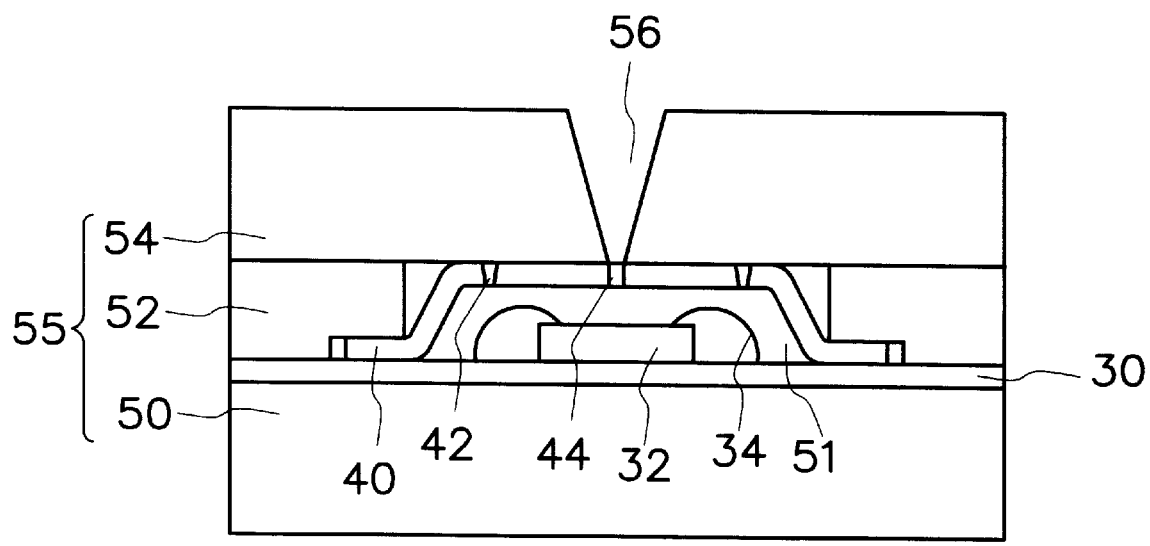
FIG. 2 is a schematic cross-sectional view of a semiconductor package according to this invention inside a three-plate mold.

FIG. 2 is a schematic cross-sectional view of a semiconductor package according to this invention inside a three-plate mold. As shown in FIG. 2, a lead frame 30 is placed inside a mold assembly 55. A silicon chip 32 is located on the lead frame 30. The lead frame 30 has a plurality of contact points (not shown) while the silicon chip 32 has a plurality of bonding pads (not shown). Bonding pads on the silicon chip 32 are electrically connected to the contact points on the lead frame 30 by a plurality of conductive wires 34. In addition, there is a heat sink 40 over the silicon chip 32. The heat sink 40 serves as a cooling surface to dissipate heat generated by the silicon chip 32 during operation and a shield that prevents any interference from external electromagnetic fields.

The semiconductor package is formed by injection packaging material 36 (FIG. 4) into a mold or packaging cavity 51. The mold assembly 50 is a three-plate mold that includes an upper mold plate 54, a middle mold plate 52 and a lower mold plate 50. Since there are no horizontal runners in the mold, there is no need to clear residual material remaining in a gate 56 area after molding.

After packaging material 36 is injected into the packaging cavity via the gate 56 and solidified, the upper mold plate 54 is removed first. When the upper mold plate 54 is detached from the middle mold plate 52, packaging material 36 breaks near the junction between the gate 56 and a pinhole gate 44 in the heat sink 40. The middle mold plate 52 is next separated from the lower mold plate 50. Obviously, besides the gate 56 for injecting packaging material 36 into the mold cavity 51, gaps must exist somewhere in the mold 55 for the expulsion of air out of the mold cavity. Moreover, to form a ball grid array package, solder balls have to be attached to the external leads of the package, as well.

Figure 3:
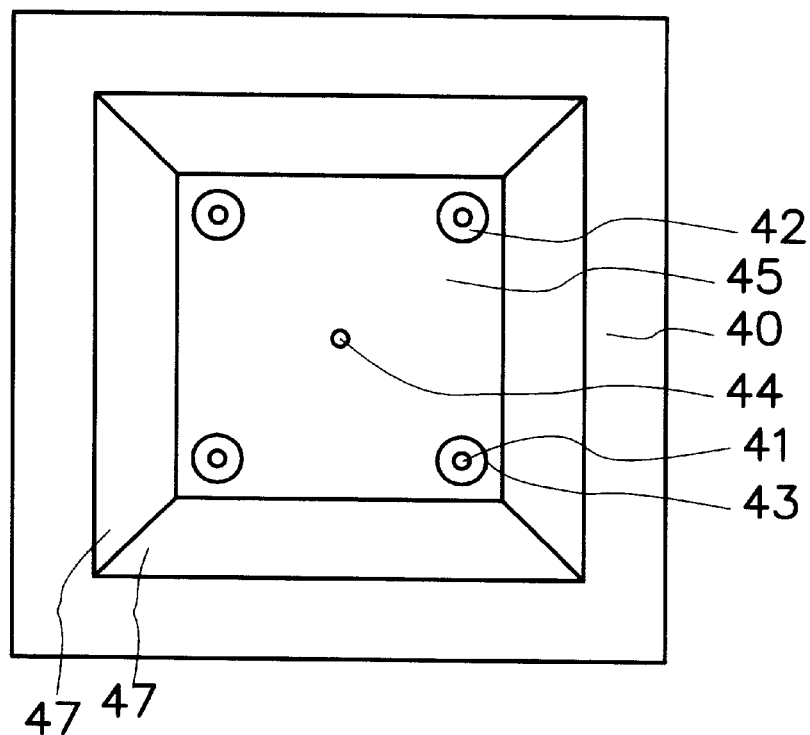
FIG. 3 is a schematic top view of a heat sink for the semiconductor package of this invention.

FIG. 3 is a schematic top view of a heat sink for the semiconductor package of this invention. As shown in FIG. 3, the pinhole gate 44 is in the middle of a top surface 45 of the heat sink 40. The pinhole gate 44 is positioned in a central location at the roof of the packaging cavity 51 so that molding pressure is more uniform and packaging material is able to fill the mold cavity 51 somewhat faster. A sprue gate 56 in the upper mold plate 54 serves to channel packaging material into the pinhole gate 44 with minimum resistance. The heat sink 40 also contains a plurality of positioning holes 42. Each positioning hole 42 is a conical cavity. The larger end of the conical cavity is on a top surface 43 whereas the smaller end of the cavity is on a lower surface 41 of the heat sink 40. After packaging material inside the hole 42 is solidified, the heat sink 40 is fixed in position. Since the heat sink 40 is gripped by packaging material 36 inside the positioning hole 42, a large portion of the cooling surface of the heat sink 40 is exposed. With a larger exposed surface for cooling, the heat sink 40 is able to carry more heat away.

Figure 4:
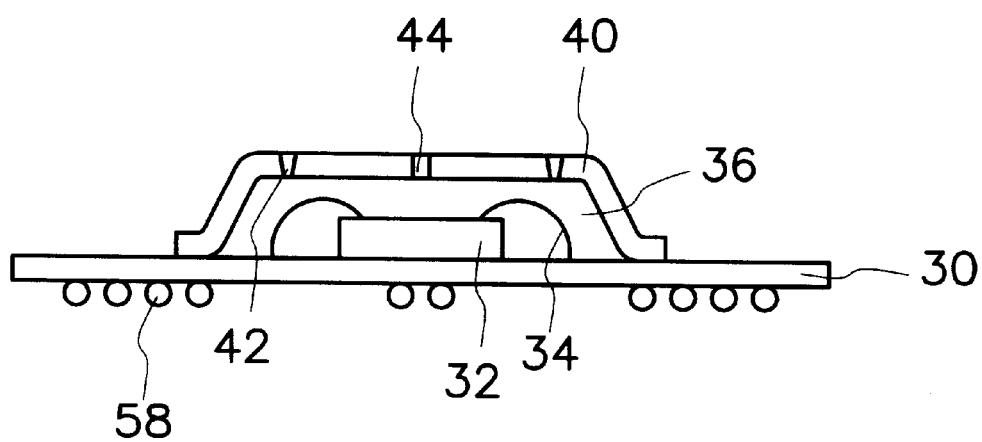
FIG. 4 is a schematic cross-sectional view of a BGA type of semiconductor package fabricated according to the embodiment of this invention.

FIG. 4 is a schematic cross-sectional view of a BGA type of semiconductor package fabricated according to the embodiment of this invention. When solder balls are finally attached to the external contact points of the semiconductor package similar to the one in FIG. 2, a BGA package is formed.

In summary, the advantages of the invention include:
1. By employing a three-plate mold and a pinhole gate in the heat sink, there is no need to manually clear residual material from the gate after molding. Therefore, the mold design of this invention is particularly suitable for automated production.
2. Because the heat sink is anchored by packaging material inside a few positioning holes, most of the cooling surface is exposed resulting, in a higher cooling capacity.
3. Central location of the sprue gate enables the packaging cavity to be filled by packaging material much more quickly. Therefore, very little residual stress remains after solidification.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package structure, comprising:
    a silicon chip;
    a heat sink over the silicon chip, wherein the heat sink has a pinhole gate in the middle;
    a lead frame having a first surface and a second surface, wherein the silicon chip is enclosed by the first surface of the lead frame and the heat sink;
    a plurality of conductive wires connecting the silicon chip with contact points on the lead frame; and
    a packaging material that encloses the silicon chip, the conductive wires and a portion of the heat sink.

2. The package structure of claim 1, wherein the heat sink further has a plurality of positioning holes.

3. The package structure of claim 2, wherein the positioning hole has an bigger end which is located away from the silicon chip.

4. The package structure of claim 1, wherein the pinhole gate is a narrow tubular pipeline.

5. The package structure of claim 1, wherein the package structure further has solder balls in ball grid array on the second surface of the lead frame.

6. A process for fabricating the semiconductor package structure as claimed as in claim 1, comprising:
    providing a silicon chip;
    providing a heat sink over the silicon chip, wherein the heat sink has a pinhole gate in the middle area;
    providing a lead frame to support the silicon chip and the heat sink, wherein the silicon chip is enclosed by the lead frame and the heat sink;
    providing a plurality of conductive wires to connect the silicon chip to the lead frame; and
    molding the silicon chip, the conductive wires and a portion of the heat sink with a packaging material.

7. The process of claim 6, further providing a plurality of positioning holes on the heat sink so as to position the heat sink when the packaging material inside the holes solidifies.

8. The process of claim 6, wherein an uniform pressure is created inside the cavity through the pinhole when a packaging material is injected into the packaging cavity.

9. The process of claim 6, wherein the molding is carried out by using a three-piece mold having an upper mold plate, a middle mold plate and a lower mold plate.

10. The process of claim 9, wherein an upper mold plate having a sprue gate is further used to channel the packaging material into the pinhole gate.

11. A semiconductor package structure, comprising:

a silicon chip;

a heat sink over the silicon chip, wherein the heat sink has at least a pinhole gate in the middle area;

a lead frame supporting the silicon chip and the heat sink and forming a cavity by the lead frame and the heat sink, wherein the silicon chip is located on the lead frame within the cavity;

a plurality of conductive wires connecting the silicon chip to the lead frame;

a packaging material that encloses the silicon chip, the conductive wires and a portion of the heat sink; and a plurality of solder balls on the opposite surface of the lead frame which doesn't support the silicon chip and the heat sink.

12. The package structure of claim 11, wherein the heat sink further has a plurality of positioning holes which are able to position the heat sink when the packing material inside the holes solidifies.

13. The package structure of claim 11, wherein the pinhole gate is a narrow tubular pipeline.

14. A semiconductor package structure, comprising:

a silicon chip;

a heat sink over the silicon chip, wherein the heat sink has a pinhole gate in the middle and a plurality of positioning holes;

a lead frame having a first surface and a second surface, wherein the chip is enclosed by the first surface of the lead frame and the heat sink, and wherein the silicon chip and the heat sink are supported by the first surface of the lead frame;

a plurality of conductive wires connecting the silicon chip to the lead frame; and a packaging material that encloses the silicon chip, the conductive wires and a portion of the heat sink.

15. The package structure of claim 14, wherein the package structure further has solder balls in ball grid array on the second surface of the lead frame.

* * * * *